United States Patent
Horng et al.

[11] Patent Number: 5,975,308
[45] Date of Patent: Nov. 2, 1999

[54] WAFER CONTAINER FOR STORING INTEGRATED CIRCUIT WAFERS

[75] Inventors: Jason Horng; Jason Hsia, both of Hsinchu, Taiwan

[73] Assignee: United Microelectronics Corp., Hsinchu, Taiwan

[21] Appl. No.: 09/181,710

[22] Filed: Oct. 28, 1998

[51] Int. Cl.⁶ .................................................. B65D 85/30
[52] U.S. Cl. ........................................... 206/710; 206/303
[58] Field of Search ..................................... 206/408, 523, 206/593, 710, 723, 832, 833; 220/23.87

[56] References Cited

U.S. PATENT DOCUMENTS

| | | | |
|---|---|---|---|
| 3,926,308 | 12/1975 | Sullivan | 206/723 |
| 4,555,024 | 11/1985 | Voss et al. | 206/710 |
| 5,454,468 | 10/1995 | Chou et al. | 206/303 |
| 5,551,571 | 9/1996 | Lin et al. | 206/710 |
| 5,699,916 | 12/1997 | Liang | 206/710 |

*Primary Examiner*—David T. Fidei
*Attorney, Agent, or Firm*—Hickman Stephens & Coleman LLP

[57] ABSTRACT

A cuboid wafer container consists of a top bucket and a bottom bucket. The top bucket further consists of a square bucket and a cylindrical bucket, the same does the bottom bucket. The cylindrical bucket and the square bucket are connected through cushion to absorb vibration for protect the wafers from being damaged by the vibration. The wafer container according to the invention can be opened and sealed without screwing the buckets, so that damages occurred on the surfaces of wafers is reduced.

10 Claims, 3 Drawing Sheets

WAFER CONTAINER FOR STORING INTEGRATED CIRCUIT WAFERS

BACKGROUND OF THE INVENTION

1. Field of the Invention

This invention relates to an equipment for semiconductor fabrication, and more particularly, to a wafer container for storing integrated circuit wafers.

2. Description of Related Art

For an average semiconductor fabrication, hundreds of integrated circuits consisting of tiny solid-state electronic devices are built on a wafer. Since the tiny solid-state electronic devices are easily damaged by slight scratches on the wafer or the abnormal vibration of the wafer. Hence, it is an important task to design a container that ensures that the wafers and the devices thereon are not damaged during the steps of storing, shipping, and retrieving wafers.

Referring to FIG. 1A, a perspective diagram of a conventional wafer container, the container consists of a cap 110 and a bucket 130, wherein the bucket 130 is used to contain wafers, and the cap 110 is used to seal the wafer container. While proceeding storing wafers, wafers are put into the bucket 130 first, and then, the bucket 130 and the wafers therein is screwed into the cap 110 to seal the container, as shown in FIG. 1B. The slit 120 on the bucket 130 is used for checking the status of the stored wafers, storing and retrieving wafers.

However, the conventional wafer container is not able to provide enough protection to the wafers therein during the sealing, and shipping. For example, screwing the cap 130 tends toward damaging the surface of wafers. It is also difficult to set the cylindrical wafer container still during shipping. The wafers is only surrounded by the wafer container without cushion of any kinds, so wafers can be damaged by the vibration generated during shipping.

SUMMARY OF THE INVENTION

It is therefore an objective of the present invention to provide a wafer container that reduces scratches and vibration, which damage wafers, during storing, retrieving, and shipping.

In accordance with the foregoing and other objectives of the present invention, the invention provides a cuboid wafer container consisting of a top bucket and a bottom bucket. The top bucket further consists of a square bucket and a cylindrical bucket, the same does the bottom bucket. The cylindrical bucket and the square bucket are connected through cushion to absorb vibration for protect the wafers from being damaged by the vibration. The wafer container according to the invention can be opened and sealed without screwing the buckets, so that damages occurred on the surfaces of wafers is reduced.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
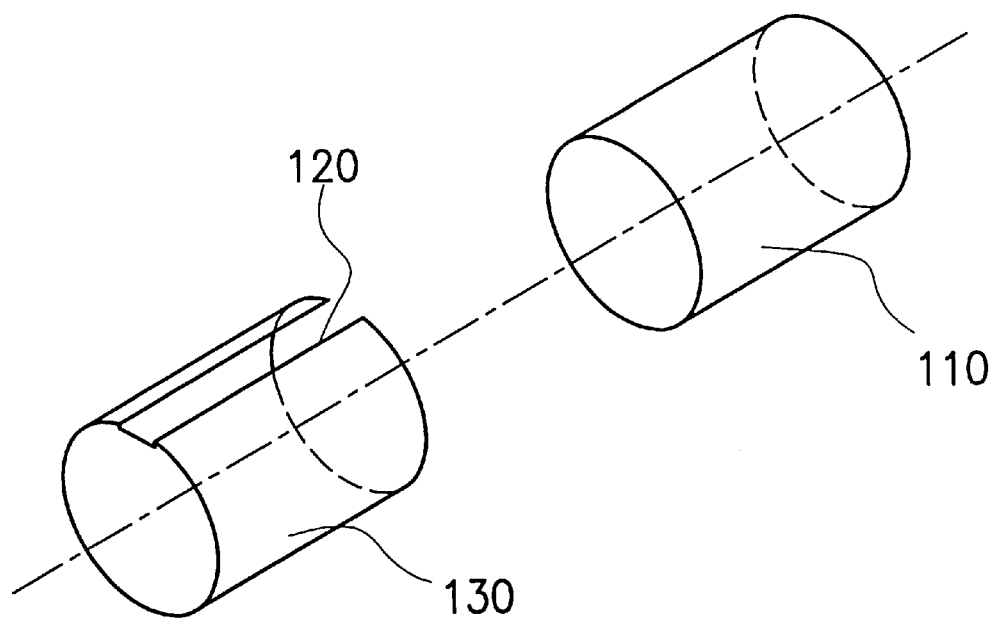
FIG. 1A is a perspective view showing the components of a conventional wafer container.
Figure 1B:
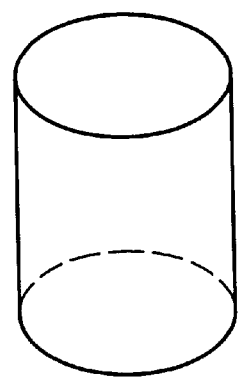
FIG. 1B is a schematic diagram showing the assembling of a conventional wafer container.
Figure 2A:
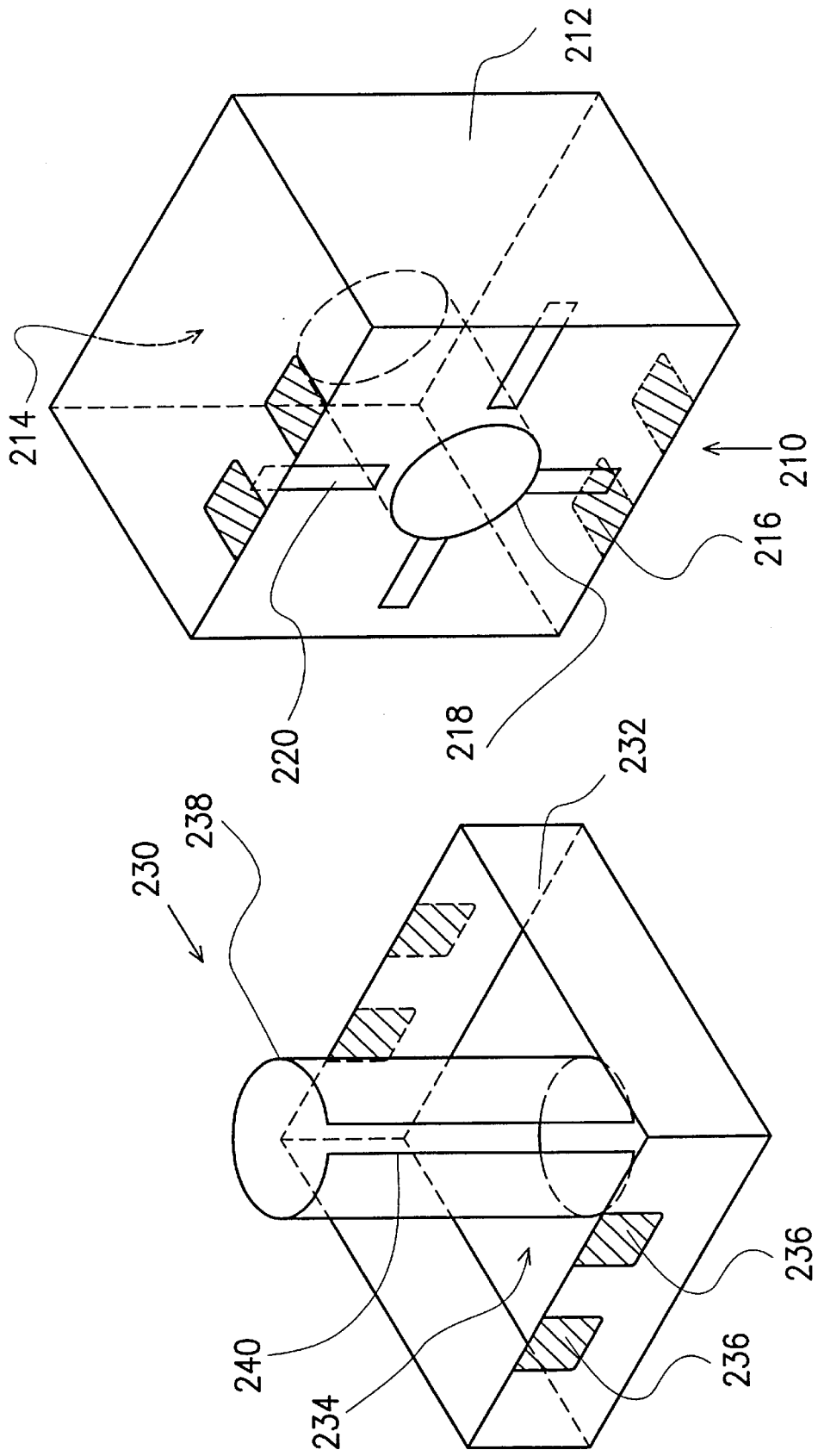
FIG. 2A is a perspective view showing the components of the wafer container in a preferred embodiment of the invention.
Figure 2B:
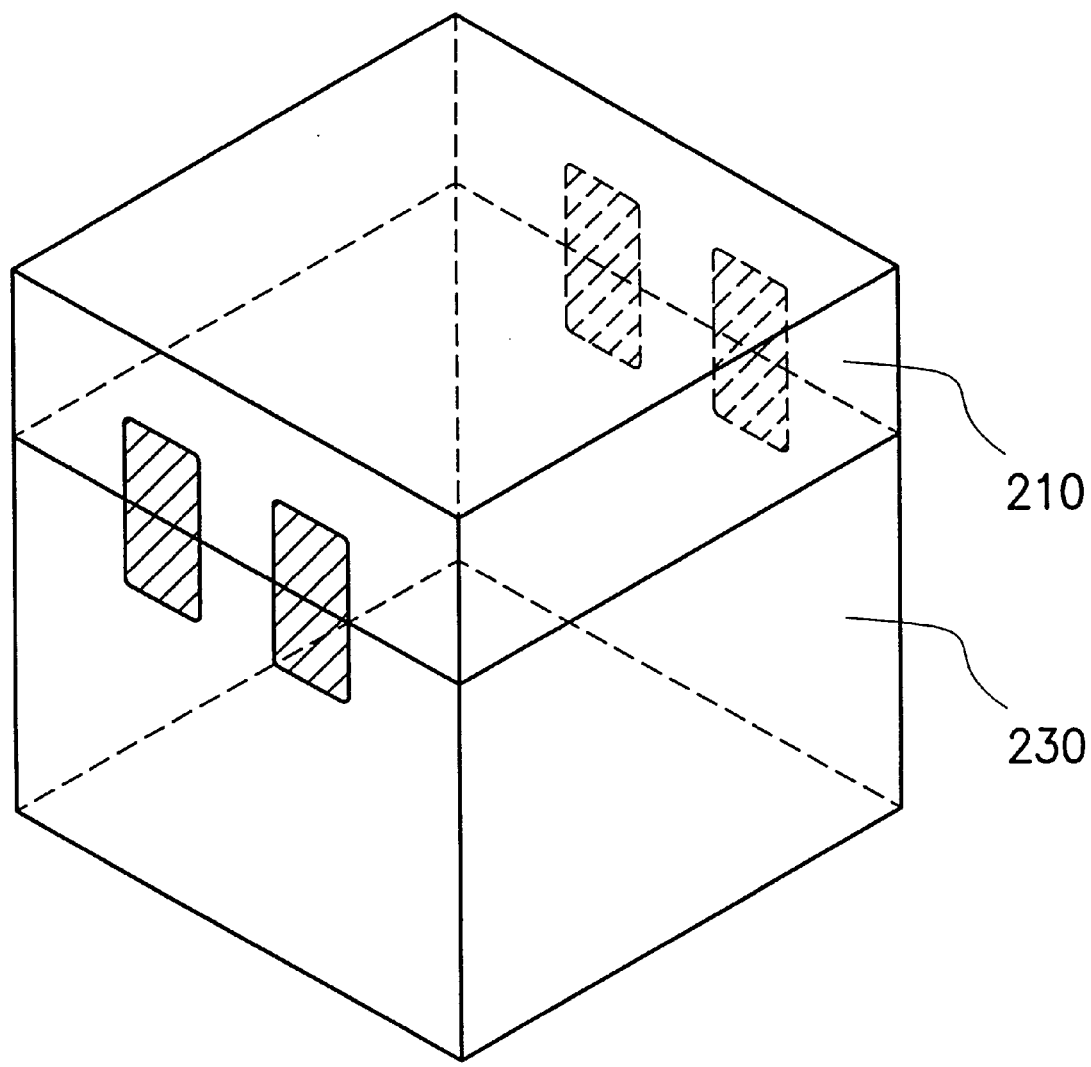
FIG. 2B is a schematic diagram showing the assembling of the wafer container in a preferred embodiment of the invention.

The invention provides a new wafer container as shown in FIGS. 2A and 2B.

Referring to FIG. 2A, a top bucket 210 consists of a cylindrical bucket 218, a square bucket 2129 a square ceiling 214, wherein the ceiling 214 is totally sealed on one opening of the square bucket 212, and wherein the other opening is left opened. On the opened opening of the square bucket 212, the edge is equipped with coupling device 216, such as a joggle or a buckle for coupling with the bottom bucket 230. The cylindrical bucket 218 is placed in the center of the square bucket 212, preferably coaxial to the square bucket 212, wherein one end of the cylindrical bucket 218 is sealed on the ceiling 214 as well, and the other end is left opened. The opened end of the cylindrical bucket 218 and the opened opening of the square bucket 212 are on the same side opposite to the ceiling 214. The casing of the cylindrical bucket 218 is connected to the inner wall of the square bucket 212 through cushions 220.

The bottom bucket 230 consists of a cylindrical bucket 238, a square bucket 232 and a square ceiling 234, wherein the square ceiling 234 is totally sealed on one opening of the square bucket 232, and the other opening is left opened. There is a coupling device, such as a joggle or a buckle equipped on the edge of the opened opening of the square bucket 232 for coupling with the top bucket. The location of the coupling device 236 is corresponding to the location of the other set of coupling device on the top bucket 212. The cylindrical bucket 238 is placed on the center of the square bucket 323, preferably coaxial to the square bucket 232, wherein one end of the cylindrical bucket is sealed by the ceiling 234, and the other end is left opened. The opened end of the cylindrical bucket 238 and the opened opening of the square bucket 232 are on the same side opposite to the square ceiling 234. A slit 240 is formed on the cylindrical bucket 238 for checking the status of stored wafers, and storing or retrieving wafers.

The foregoing square bucket 232 and the square ceiling 934 can be replaced by a square base, such as a solid cuboid base or a base of the similar shape and function. The cylindrical bucket 238 is still placed on the center of the base, preferably coaxial to the base. The coupling device 236 is placed on the edge of the base correspondingly to the location of the coupling device 216 on the top bucket.

Referring to FIG. 2B, the wafer container functions by using two set of coupling devices 236 and 216 to lock the top bucket 210 on the bottom bucket 230. It is referable to have the inner diameter of the cylindrical bucket 218 of the top bucket 210 slightly larger than, or the same as the outer diameter of the cylindrical bucket 238 of the bottom bucket 230, so that the cylindrical bucket 238 is inserted into the cylindrical bucket 218 while coupling.

Because the wafer container of the invention has a cuboid profile, the stability of the wafer container during shipping is improved, and the vibration is suppressed. Hence, the wafers is more protected.

Since the wafer container of the invention is closed by simply put the top bucket 210 on the bottom bucket 230 without the need of screwing-on action, the occurrence of scratches on the surfaces of wafers is reduced.

The cushion 220 used in the wafer container of the invention for connecting the cylindrical bucket 218 and the square bucket 214 further absorbs vibration during shipping, so the wafers are protected from the damages caused by vibration.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A wafer container comprising:
   a bottom bucket comprising a substantially square base having an edge, and a substantially cylindrical bucket having a first end and a second end, wherein the cylindrical bucket is placed on the square base on the first end;
   a top bucket used to cover the bottom bucket; and
   at least a coupling device for coupling the top bucket and the bottom bucket, wherein the coupling device further comprises a first part and a second part, the second part being affixed to the edge of the square base.

2. A wafer container comprising:
   a bottom bucket,
   a top bucket, which is used to cover the bottom bucket; and
   at least a coupling device comprising a first part and a second part for coupling the top bucket and the bottom bucket;
   wherein the top bucket further includes
      a substantially square bucket having an inner surface, a first opening and a second opening, wherein an edge of the square bucket is equipped with the first part of the coupling device;
      a substantially cylindrical bucket placed in the center of the square bucket, wherein the cylindrical bucket has an outer surface, a first end and a second end, and wherein the first end and the first opening are at a first side, and, the second end and the second opening are at a second side opposite to the first side;
      a square ceiling sealing the first opening and the first end; and
      a set of cushions placed between the square bucket and the cylindrical bucket and having contact with the inner surface and the outer surface.

3. The wafer container of claim 1, wherein the cylindrical bucket comprises at least one slit cutting through the first end and the second end.

4. A wafer container comprising:
   a bottom bucket;
   a top bucket, which is used to cover the bottom bucket; and
   at least a coupling device comprising a first part and a second part for coupling the top bucket and the bottom bucket such that the first part is affixed to the top bucket;
   wherein the bottom bucket includes
      a square base further including a square bucket having a first opening and a second opening, wherein an edge of the square bucket is equipped with the second part of the coupling device for coupling with the first part of the coupling device on the top bucket,
      a cylindrical bucket having a first end and a second end such that the cylindrical bucket is placed on the square base on the first end, and
      a square ceiling for sealing the first opening and the first end.

5. The wafer container of claim 2, wherein the coupling device includes a pair of joggles placed on the top bucket and the bottom bucket respectively.

6. The wafer container of claim 2, wherein the coupling device includes a pair of buckles placed on the top bucket and the bottom bucket respectively.

7. The wafer container of claim 4, wherein the cylindrical bucket comprises at least one slit cutting through the first end and the second end.

8. The wafer container of claim 4, wherein the coupling includes a pair of joggles placed on the top bucket and the bottom bucket respectively.

9. The wafer container of claim 4, wherein the coupling device includes a pair of buckles placed on the top bucket and the bottom bucket respectively.

10. The wafer container of claim 2, wherein the cylindrical bucket comprises at least one slit cutting through the first end and the second end.

\* \* \* \* \*